(12) United States Patent
McFeely et al.

(10) Patent No.: US 7,037,834 B2
(45) Date of Patent: May 2, 2006

(54) CONSTANT EMISSIVITY DEPOSITION MEMBER

(75) Inventors: Fenton Read McFeely, Ossining, NY (US); John Jacob Yurkas, Stamford, CT (US); Sandra Malhotra, Beacon, NY (US); Andrew Simon, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 3 days.

(21) Appl. No.: 10/851,384

(22) Filed: May 22, 2004

(65) Prior Publication Data

US 2005/0260833 A1    Nov. 24, 2005

(51) Int. Cl.
*H01L 21/44* (2006.01)

(52) U.S. Cl. ............... 438/680; 438/681; 438/800; 427/585; 118/715

(58) Field of Classification Search ........ 438/679–681, 438/800; 118/715; 427/248.1, 585
See application file for complete search history.

(56) References Cited

U.S. PATENT DOCUMENTS

| | | | |
|---|---|---|---|
| 6,313,035 B1 * | 11/2001 | Sandhu et al. | 438/681 |
| 6,454,860 B1 * | 9/2002 | Metzner et al. | 118/715 |
| 6,582,522 B1 | 6/2003 | Luo et al. | 118/715 |
| 6,802,906 B1 | 10/2004 | Jin et al. | 118/715 |
| 2002/0192370 A1 | 12/2002 | Metzner | 427/248.1 |

* cited by examiner

*Primary Examiner*—Hsien-Ming Lee
(74) *Attorney, Agent, or Firm*—George Sai-Halasz; Wan Yee Cheung

(57) ABSTRACT

A deposition member adapted for discharging a deposition material during a deposition process can acquire a coating during the deposition. Such an initial emissivity value is selected for the deposition member, before any of the coating became deposited, that the emissivity of the deposition member remains substantially unchanged during the deposition process. In a representative embodiment the deposition member is coated with an appropriate thin layer for achieving the selected emissivity value.

15 Claims, 1 Drawing Sheet

CONSTANT EMISSIVITY DEPOSITION MEMBER

FIELD OF THE INVENTION

The present invention relates to the deposition of thin films in the course of fabricating semiconductor devices.

BACKGROUND OF THE INVENTION

Today's integrated circuits include a vast number of devices. Smaller devices are key to enhance performance and to improve reliability. Smaller devices entail ever more difficult manufacturing techniques, combined with more reliability and reproducibility requirements. Semiconductor devices are in need of a large variety of thin films, or layers; metallic, insulating, semiconducting. Over the years many thin layer deposition techniques have been devised. Many of these are so called low pressure deposition processes, which as the name implies, carry out the deposition at pressures well below the atmospheric region. Examples of such low pressure deposition techniques are: chemical vapor deposition (CVD) including metal organic chemical vapor deposition (MOCVD), molecular beam epitaxy (MBE), atomic layer deposition (ALD), physical vapor deposition (PVD) and others. The layer thicknesses of interest can range from many microns to a few atomic layers on the semiconductor substrate undergoing processing. The deposition of these films are for diverse purposes, such as the formation of wiring structures, electrical contacts, gate electrodes, diffusion barriers, and others.

It is noted that for the sake of simplicity the discussion here is mostly for the specific case of CVD, but the scope of the invention is not limited for this particular process. During processing typically a stream of precursor gas is passed into the system for deposition onto a substrate. In case of metal deposition by MOCVD the precursor gas is comprising organometallic species containing the metal to be deposited, and deposition usually occurs after some surface chemical reactions on the substrate. For efficient manufacturing it is necessary that the deposition apparatus in repetitive operation produce films with constant physical properties (such as thickness, resistivity, crystallographic phase, surface roughness, etc.) over hundreds, or even thousands of substrates without interruption. To do so the critical deposition parameters must be kept constant. One of these parameters is the substrate temperature during deposition. The film growth rate is generally dependent upon the substrate temperature, so that any drift of the substrate temperature with repetitive reactor operation will lead to a deviation of the film properties from the desired values. For instance, in a MOCVD process, such as W deposition from $W(CO)_6$, besides layer thickness, the resistivity, the crystallographic phase of the deposited metal, and the surface roughness will also vary if the substrate temperature changes. For this deposition process, a substrate temperature change of as little as 5% can lead to unacceptable changes in film properties.

SUMMARY OF THE INVENTION

In a low pressure, cool wall CVD reactor, the substrate temperature is a matter of delicate balance between heat flows from the heater to the substrate and from the substrate to its surroundings. This delicate balance can be altered if the optical properties, i.e. the emissivity ($\epsilon$), of some of the involved components changes. The emissivity $\epsilon$ is an inherent property of an object, defined as the ratio of the actual amount of electromagnetic radiation emitted by the object to the amount emitted by an ideal blackbody at the same temperature. The value of the emissivity $\epsilon$ is a fractional value between 0 and 1, with 1 being a perfectly emitting blackbody. Unfortunately, in actual practice the emissivity $\epsilon$ of a deposition member, or showerhead, is frequently subject to change as a result of repetitive operation. For instance, it is often found that pyrolytic decomposition of a MOCVD precursor, although minimized by low showerhead temperature, is not completely avoidable. As such material builds up it changes the showerhead from typically being a bright reflective surface to a dull grey-black absorptive surface. This emissivity change in the deposition member leads to substrate temperature drifts.

The disclosed invention solves the problem of deposition member emissivity induced temperature drift by introducing deposition members with such an initial emissivity value $\epsilon_0$, that the emissivity $\epsilon$ of the deposition member does not change even as material build-up occurs on the deposition member in the course of operation.

BRIEF DESCRIPTION OF THE DRAWING

These and other features of the present invention will become apparent from the accompanying detailed description and drawing, wherein.

DETAILED DESCRIPTION OF THE INVENTION

Figure 1:
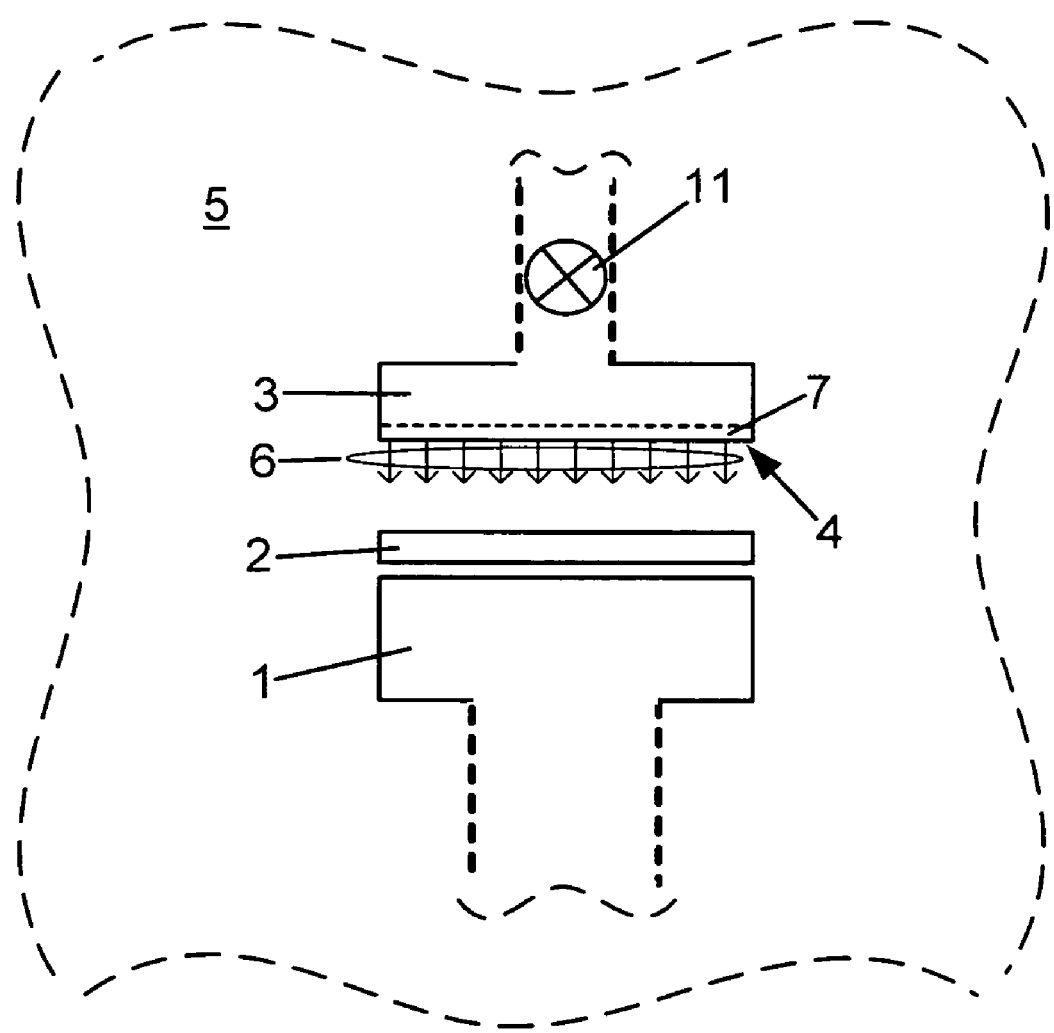
FIG. 1 shows a symbolic cross sectional view of a deposition apparatus.

FIG. 1 shows a symbolic cross sectional view of a deposition apparatus, typically a low pressure deposition apparatus. Although the present invention is applicable to any apparatus used for depositing of material layers, the figure is closest to a chemical vapor deposition (CVD) a low pressure apparatus, as an exemplary embodiment. One skilled in the art would appreciate that in general such system are very complex. Consequently, the figure is depicting only those parts of the apparatus which are relevant for the present invention with the surrounding dashed lines indicating the rest of the system.

A deposition member 3, in case of a CVD, or MOCVD apparatus called a showerhead, is adapted to discharge at least one deposition material 6 during a low pressure deposition process. In an exemplary embodiment, such as MOCVD, deposition materials are typically precursor gases. However, in differing low pressure deposition apparatuses, for instance in MBE systems, the deposition material and the adaptation would take a different form, as one skilled in the art would recognize. Depending of the systems and the materials involved one skilled in the art would notice that the adaptation of the deposition member 3 for the task of discharging deposition materials can have many variations. In the figure the adaptation is symbolically indicated by a valve 11, which can control flow of deposition materials 6 toward the showerhead.

A substrate 2 is facing the deposition member 3. The substrate 2 is the intended recipient of the deposition material 6. During the low pressure deposition process the substrate 2 is in radiative coupling with a heater element 1. The deposition process is occurring under controlled pressure 5, typically in a chamber protected by a proper walls (not shown, in the figure).

The vacuum equipment of the apparatus typically is able to maintain a base pressure of less than about 10 mtorr, typically less than about $10^{-5}$ torr. During the low pressure deposition process the heater element 1 raises the temperature of the substrate 2 to a deposition temperature, usually in the range of 100° C.–600° C., and most typically in the range of 300° C.–500° C., and a stream of deposition materials 6, typically precursor gases, are passed through showerhead 3 directed onto the substrate 2. Typically, some of the deposition material 6 chemically reacts on the elevated temperature substrate 2, resulting in the desired deposition of a film. During this deposition the introduction of the deposition materials stream 6 will cause the pressure in the reactor to rise from the base pressure to the deposition pressure 5. The value of the deposition pressure is typically selected so as to produce films having desired properties. One skilled in the art would recognize that the desired film properties constrain the range of deposition pressures 5. The low pressure regime, the one that can most benefit from this invention, refers to the case in which the deposition gas pressure is too low for effective conductive or convective heat transfer, typically below about 1 torr. However, having a showerhead member with emissivity that remains substantially the same during operation can be practiced and applied to other pressure regimes as well.

Cool wall operation of the deposition apparatus refers to the situation in which only the heater element 1 and the substrate 2 are heated to a temperature at which precursor gas reactions take place, and the other surfaces are maintained at substantially lower temperatures. This is a common situation in the art of depositions. Usually the reactor walls and showerhead 3 are actively cooled to maintain a low temperature, specifically to suppress the reactions on these surfaces. In a typical situation, the substrate 2 might be held in the range of about 300° C.–500° C., while the showerhead 3 would be held at about 50–150° C. A typical spacing between the deposition member 3 and the substrate 2 is on the order of 1 cm, accordingly, a temperature gradient of several hundred ° C./cm can exist in this region.

In the low pressure regime, heat is conveyed from the heater element 1 to the substrate 2 primarily via radiative coupling, as the deposition pressure 5 usually is too low for effective conductive or convective heating. As a consequence, the thermal link between the substrate 2 and the heater element 1 is a weak one, and a substantial thermal gradient may exist between the heater element 1 and the substrate 2. This gradient may be on the order of 100° C./cm. In some cases this gradient may be reduced by mechanically or electrostatically clamping the substrate 2 to the heater element 1, but this is frequently infeasible, owing to requirements of the deposition process. The figure shows no particular supporting mechanism for the substrate 2 because one skilled in the art would know many customary ways of how to secure the substrate 2 in place during the deposition process.

It is therefore clear that for cold wall deposition apparatus, such as a MOCVD reactor, with an unclamped substrate, the substrate 2 temperature is a matter of delicate balance between heat flows from the heater element 1 to the substrate 2 and from the substrate 2 to its surroundings. In the following description the terms of deposition member and showerhead will both be used interchangeably, since a CVD showerhead is a representative embodiment of a deposition member. Heat is radiated from the heater element 1 to the substrate 2, and heat is radiated from the substrate 2 to (primarily) the deposition member 3, where some is absorbed and some is reflected/reradiated back onto the substrate 2 from the deposition member surface 4. This delicate balance can be altered if the optical properties, e.g. the emissivity ($\epsilon$), of the deposition member surface 4 changes. The emissivity $\epsilon$ is the ratio of the actual amount of electromagnetic radiation emitted by an object to the amount emitted by an ideal blackbody at the same temperature. The value of the emissivity $\epsilon$ is a fractional value between 0 and 1, with 1 being a perfectly emitting blackbody. The emissivity, as such, is an inherent property of any object. A change in the showerhead surface emissivity e would change the net flux of heat out of the substrate 2, while the net heat transmitted from the heater element 1 would be unaffected. Thus the substrate temperature will change with a change of deposition element emissivity $\epsilon$ change. Furthermore, there may be nothing to alert the reactor operator that such a change had occurred. In deposition apparatuses of the current art, typically there is no direct real-time thermometry of the substrate 2 available. Instead, the temperature of the heater element 1 is measured and controlled. Since the thermal mass of the heater element 1 is usually much larger than that of the substrate, the substrate 2 temperature could drift substantially without affecting the heater element 1 temperature.

Substrate temperature during deposition is important because the film growth rate is generally dependent upon the substrate temperature, so that any drift of the substrate temperature with repetitive reactor operation will lead to a deviation of the film thickness from the desired value. In addition, for many processes other physical properties of the deposited film, such as resistivity, crystallographic phase, surface roughness, etc. can also change if the substrate temperature changes. Often, substrate temperature change of a few percent can lead to unacceptable changes in film properties.

In actual practice the emissivity $\epsilon$ of the showerhead surface 4 is frequently subject to change as a result of operation. In the course of operation it can occur that, although minimized by the relatively low temperature of the deposition member 3, adventitious, or unintended, build-up of the deposition material 6, or some chemical product of this material, back to the showerhead surface 4 is not completely avoidable. As such a deposition, referred to as first coating, builds up on the deposition member surface 4, it changes its optical properties, typically from being a bright reflective surface to a dull grey-black absorptive surface. As a result, the emissivity of surface 4 changes, which leads to a substrate temperature drift.

The present invention provides that the deposition member 3 emissivity $\epsilon$ does not change significantly during the deposition process. This is accomplished by providing surface 4 with an initial emissivity value $\epsilon_0$ such that the emissivity $\epsilon$ of surface 4 remains substantially unchanged during the deposition process, which means it remains substantially unchanged as the surface acquires a first coating. Accordingly the initial emissivity value $\epsilon_0$ of surface 4 must be substantially the same as that emissivity $\epsilon$ which pertains to the surface 4 when a first coating is building up on it during the deposition process. While the emissivity $\epsilon$ is an inherent property of the deposition member, the initial emissivity value $\epsilon_0$ is one specific value of the emissivity $\epsilon$.

In a representative embodiment, maintaining a substantially constant emissivity $\epsilon$ can done by manufacturing the deposition member of a material which has a surface with the desired optical properties, e.g., a right initial emissivity value. In an another exemplary embodiment, the deposition member 3 can be manufactured with a surface coating, referred to as a second coating 7, which possesses such an initial emissivity value that it remains substantially unchanged even after a buildup of the first coating. The build-up of the first coating typically results from an adventitious, or unintended, deposition. The initial emissivity value, which is the emissivity of the deposition member before it would have acquired any of the first coating, is selected to be such a value that the emissivity of the deposition member remains substantially equal to this initial emissivity value even while it is accumulating the first coating.

One skilled in the art would recognize that, apart from the optical properties, the particular surface coating should preferably have properties or characteristics that are appropriate for specific applications. For example, for low pressure applications, the coating should preferably not outgas excessively, and be compatible with the vacuum requirements of the process. In practice that means that the base pressure of the reactor with the showerhead coating in place should be essentially the same as the pressure which would be exhibited by an analogous system with an uncoated showerhead. Second, the surface, or second, coating should preferably not be substantially more reactive towards the at least one deposition material 6 than the materials comprising the reactor walls. Third, it is desirable that the surface coating be highly adherent to avoid particulate contamination in the reactor. Fourth, the surface coating should preferably be able to withstand whatever cleaning procedure is used to remove deposits from the reactor interior surfaces.

The material build-ups, or first coatings, on the showerhead 3 are often of a dull dark grey color. This is because the showerhead, being at a temperature substantially below the ideal deposition temperature, tends not to be coated with a bright film characteristic of pure metal, but with a dark film characteristic of a metal heavily contaminated with carbon, oxygen or nitrogen, depending on the exact nature of the organometallic precursor. While the color of the first coatings can vary, depending on the specific process being performed in the apparatus, they are generally of this nature, and it is coatings of this nature which typically lead to temperature drifts of the substrate. The qualitative appearance of these materials is only a guide to selection. It is noteworthy that the infrared emissivity properties of the films are also influential. It might therefore be possible to use a second coating that, from a visible-light point of view might not seem to have the right emissivity $\epsilon$, if its behavior in the infrared provided compensation. Accordingly, candidate materials for the second coating 7 could be selected from the group of metal nitrides, metal carbides, and metal sulfides. Materials selected from this group generally have low vapor pressure, so that they would be compatible with the vacuum requirements of the process, and would not tend to be any more reactive towards the precursors than the adventitious deposits themselves. The materials from this group should generally be capable of being deposited in an adherent fashion. However, there might not exist in all cases an easy or inexpensive method available to achieve this, so that this is a key concern for a practical selection of a specific surface coating material. Also, as one skilled in the arts would recognize the question of the compatibility of a surface coating with a specific cleaning procedure must be addressed on a case by case basis.

Exemplary second coatings should be sufficiently thick that they become, in a practical sense, opaque. Thus, first coating build-up during process operation will not cause a significant change in emissivity. A preferred range for the thickness would be 100–1000 nm, although films as thin as 50 nm might suffice in specific cases. Generally the upper limit for the second coating thickness would be set by the adhesion characteristics of the film to the deposition member.

An exemplary embodiment of the invention for the case of tungsten (W) deposition by MOCVD process from a $W(CO)_6$ precursor is now detailed. MOCVD showerheads are usually constructed from polished aluminum. As one skilled in the art would know aluminum is preferred because of its machinability and high thermal conductivity. The aluminum showerhead usually is cleaned to a bright polish for vacuum considerations. The W deposition reaction is optimally carried out in a cool wall reactor at deposition pressures less than 0.5 torr, and preferably at pressures less than 150 mtorr, with a substrate temperature of greater than about 350° C. Under these conditions the showerhead 3 may be subject to adventitious deposition which result in temperature drifts. These temperature variations can cause undesirable variations in the film thicknesses, the film resistivities, or both. It was experienced while running a MOCVD reactor, which was without a proper initial emissivity value $\epsilon_0$ showerhead, that the W film resistivity would drift upward by more than 20% after 1 week in deposition operation. To achieve greater stability the showerhead 3 was applied a second coating 7 with tungsten disulfide ($WS_2$). This was accomplished using the a commercially available process known as "dichronite". The dichronite process is a method of impregnating the surface of a metal with the $WS_2$. This process was originally intended as a lubricant, especially for high vacuum environments and as such was designed for adherence and low outgassing. Tungsten disulfide is chemically more inert than metallic tungsten, thereby not attracting an excessive first coating to the showerhead. The MOCVD reactor is cleaned of built up deposits by wet cleaning with hydrogen peroxide—water solutions. It was found that the dichronite treated showerhead could successfully be cleaned by such solutions without affecting the dichronite coating. This second coating 7 had the requisite optical properties giving an initial emissivity value $\epsilon_0$ which was essentially the same as the emissivity $\epsilon$ of the showerhead 3 with the build-up of a first coating: in over 60 days of operation neither the film resistivity nor the deposition rate showed any evidence of systematic variation.

Although tungsten (W) deposition by MOCVD process from a $W(CO)_6$ precursor was exemplified here one skilled in the art would recognize that processes, such as W nitride deposition from $W(CO)_6$ with the addition of $NH_3$; Ru deposition from $Ru_3(CO)_{12}$); Re deposition from $Re_2(CO)_{10}$; TaN from a variety of Ta amides and imides with $NH_3$; TaSiN from a variety of Ta amides and imides with $SiH_4$; and many more can also benefit from the disclosed invention.

Many modifications and variations of the present invention are possible in light of the above teachings, and could be apparent for those skilled in the art. The scope of the invention is defined by the appended claims.

We claim:

1. An apparatus, comprising:
    a deposition member adapted for discharging at least one deposition material during a deposition process, wherein said deposition member acquires a first coating during said deposition process, wherein before acquiring any of said first coating said deposition member has an initial emissivity value, and wherein the emissivity of said deposition member remains substantially equal to said initial emissivity value during said acquiring of said first coating, wherein said deposition member is a showerhead in a cool wall metal-organic chemical vapor deposition (MOCVD) reactor, wherein said deposition member comprise a second coating chosen from the group consisting of metal nitrides, metal carbides, tungsten sulfides, and combinations thereof, and wherein said second coating possesses said initial emissivity value.

2. The apparatus of claim 1, further comprising a heater element, wherein during said deposition process said heater element is radiatively coupled to a substrate, wherein said substrate is recipient of said at least one deposition material.

3. The apparatus of claim 2, wherein said least one deposition material is $W(CO)_6$.

4. The apparatus of claim 1, wherein said deposition member has an active cooling mechanism.

5. The apparatus of claim 1, wherein said second coating comprise tungsten disulfide ($WS_2$).

6. The apparatus of claim 1, wherein said second coating is between about 50 nm and 1000 nm thick.

7. A method for deposition, comprising:
  discharging at least one deposition material from a deposition member, wherein said deposition member has an initial emissivity value that the emissivity of said deposition member remains substantially equal to said initial emissivity value during said deposition, wherein during said deposition said deposition member acquires a first coating;
  providing said deposition member with a second coating selected from the group consisting of metal nitrides, metal carbides, tungsten sulfides, and combinations thereof, and wherein said second coating possesses said initial emissivity value; and
  selecting said deposition member to be a showerhead in a cool wall metal-organic chemical vapor deposition (MOCVD) reactor.

8. The method of claim 7, further comprising selecting said deposition to be carried out at a pressure of less than about 1 torr.

9. The method of claim 8, further comprising selecting said deposition to be carried out at a pressure of less than about 0.15 torr.

10. The method of claim 7, further comprising actively cooling said deposition member during said deposition.

11. The method of claim 7, wherein said second coating is selected to be between about 50 nm and 1000 nm thick.

12. The method of claim 7, further comprising selecting said second coating to comprise tungsten disulfide ($WS_2$).

13. The method of claim 12, further comprising selecting said showerhead to be at a temperature between about 50° C. and 150° C.

14. The method of claim 13, further comprising selecting said least one deposition material to be $W(CO)_6$.

15. The method of claim 14, further comprising:
  radiatively heating a substrate to between about 300° C. and 500° C.; and
  receiving said $W(CO)_6$ on said substrate.

* * * * *